US006847926B1

(12) United States Patent
Ballam

(10) Patent No.: US 6,847,926 B1
(45) Date of Patent: *Jan. 25, 2005

(54) METHOD OF DISTINGUISHING BIDIRECTIONAL PINS

(75) Inventor: Peter Ballam, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 817 days.

This patent is subject to a terminal disclaimer.

(21) Appl. No.: 09/692,297

(22) Filed: Oct. 19, 2000

(30) Foreign Application Priority Data

Oct. 29, 1999 (GB) .............................. 9925655

(51) Int. Cl.[7] .............................................. G06F 17/50
(52) U.S. Cl. ................................. 703/14; 703/4; 716/5
(58) Field of Search ........................... 703/3, 4, 13, 14; 716/4, 5; 714/33

(56) References Cited

U.S. PATENT DOCUMENTS

| | | | | |
|---|---|---|---|---|
| 5,808,492 | A | | 9/1998 | Chow ........................ 327/108 |
| 5,974,241 | A | | 10/1999 | Fusco .................... 395/500.03 |
| 5,995,740 | A | * | 11/1999 | Johnson ....................... 703/20 |
| 6,279,146 | B1 | * | 8/2001 | Evans et al. ................... 716/18 |
| 6,308,292 | B1 | * | 10/2001 | Fusco ........................ 714/738 |
| 6,353,915 | B1 | * | 3/2002 | Deal et al. ..................... 716/4 |
| 6,363,509 | B1 | * | 3/2002 | Parulkar et al. ............ 714/738 |
| 6,370,493 | B1 | * | 4/2002 | Knapp et al. ................ 703/14 |
| 6,499,125 | B1 | * | 12/2002 | Ohta et al. .................. 714/734 |
| 6,560,757 | B1 | * | 5/2003 | Ballam .......................... 716/5 |

FOREIGN PATENT DOCUMENTS

| | | | |
|---|---|---|---|
| EP | 0 700 008 | 3/1996 | ........... G06F/17/50 |
| JP | 55082972 A | * 6/1980 | ........... G01R/31/26 |

OTHER PUBLICATIONS

Lam, K. et al., "Simultaneous bidirectional signalling for IC systems", 1990 IEEE International Conference on Computer Design VLSI in Computers and Processors Proceedings, Sep. 17–19, 1990, pp. 430–433.*

Troy Scott, "Adopting VHDL for PLD design and simulation", EDN, Apr. 9, 1998, vol. 43, Issue 8, pp. 139–145.*

IEEE Std 1164–1993: *IEEE Standard Jmultivalue Logic System for VHDL Model Interoperability* (*Std logic 1164*), 1993, IEEE, New York, XP002135132, p. 17.

* cited by examiner

*Primary Examiner*—Anthony Knight
*Assistant Examiner*—Crystal J Barnes
(74) *Attorney, Agent, or Firm*—Lisa K. Jorgenson; James H. Morris; Wolf, Greenfield & Sacks, P.C.

(57) ABSTRACT

A method is described for distinguishing between an input or output signal on a bi-directional pin of a model of a hardware circuit. The method includes the steps of for a bi-directional pin of said model applying signals to said pin at a reduced drive strength such that a driven signal on said pin will be superimposed over the applied signal, and comparing the drive strength on the bi-directional pin and responsive to said comparison determining whether the bi-directional pin is an input or output.

9 Claims, 5 Drawing Sheets

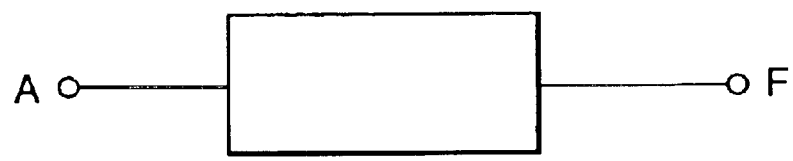
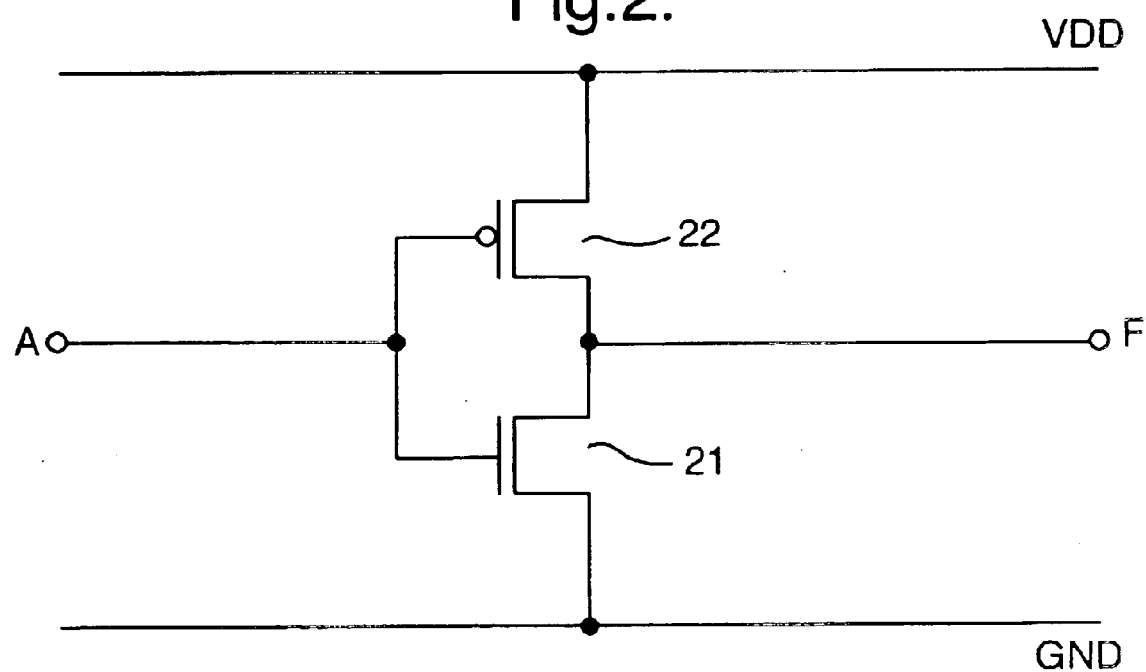

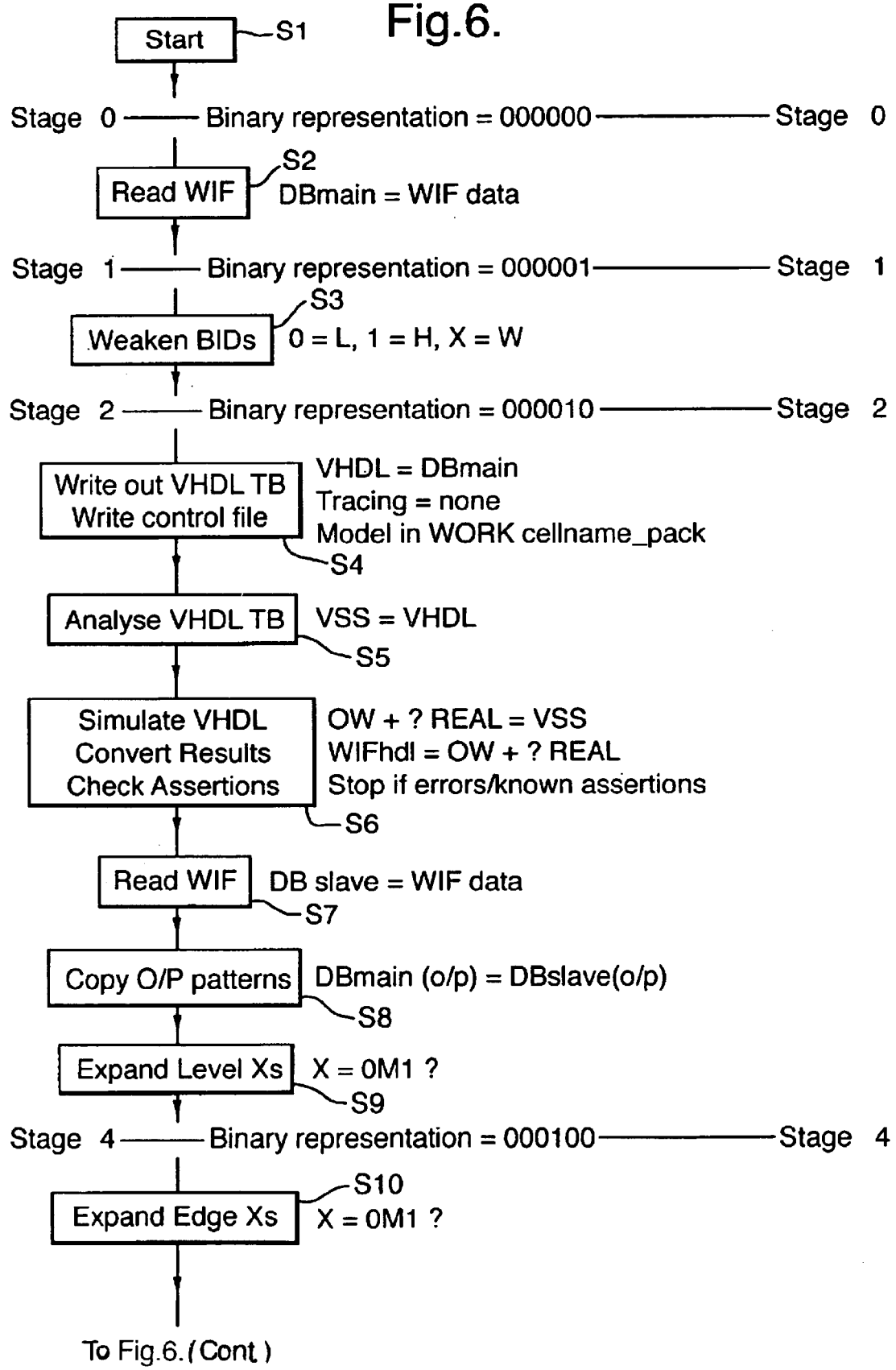

METHOD OF DISTINGUISHING BIDIRECTIONAL PINS

BACKGROUND OF THE INVENTION

1. Field of the Invention

The present invention relates to a method of distinguishing between an input or output signal on a bi-directional pin of the model of a hardware circuit and, in particular, but not exclusively to the determination of the nature of a bi-directional pin in a VHDL.

2. Discussion of the Related Art

In the past during mixed signal IC device or 'chip' development, testing departments have had to wait until a device has been reduced to silicon before functional tests can be performed. In view of the increase in the general requirements for mixed signal (using digital and analogue signals) chips and their shrinking product shelf life, the need to reduce development time has risen accordingly. By testing IC device designs prior to reduction to silicon overall development times can be reduced considerably. This means that a device can be brought to market more quickly.

A number of test simulators are known which allow test departments to test how a device will function as soon as a preliminary design is completed. This can be prior to the reduction to silicon of the device.

One type of test simulator is an analog simulator which may be used for non-linear DC, non-linear transient and linear AC analysis. SPICE is an example of an industry standard general-purpose analog circuit simulator. A development of the SPICE simulator is the ELDO simulator which provides the functionality, performance and accuracy of SPICE-level simulation along with improved algorithms which allow more complex circuits to be simulated and also provides a mixed signal simulation capability.

Analog simulators, as the name suggests, allow simulation of a hardware cell being tested at the analog signal level. The simulator provides performance results through the whole range of analog input signals and allows for voltage sweeps. In other words, the cell is tested over a wide range of voltage values, the voltage values being for example applied as inputs. As a result analog simulators provide very accurate descriptions of the designed device operation. However simulation times can be prohibitively protracted especially when a design comprises many thousands or hundreds of thousands of cells to be simulated.

As a solution to the task of describing circuits of such large scale, digital simulators have been developed. Numerous digital simulators have been developed to model the behaviour of circuitry described using a hardware description language (HDL). HDL is a programming language which has been designed and optimised for simulating and thereby describing behaviour of digital circuitry. HDL allows electrical aspects of circuit behaviour to be precisely described. However since only digital signals (which have one of two states) are simulated simulation time scales are much reduced. Additionally, only changes of logic level trigger an evaluation of the effect. A specific example of HDL is the very high speed integrated circuit HDL known as VHDL.

HDL models typically provide a behavioural description of the circuitry of the designed device which can be synthesised into a net list which includes circuit diagrams of the device saved in textual form. In other words, the circuitry of the device is broken down into cells or small circuit portions, each of which has a known behaviour. These cells or small circuit portions are listed in the net list, operation of the device is simulated by stimulating the net list by the application of a test bench. Test benches are HDL descriptions of circuit stimulus. The outputs of the cell in response to stimulus are compared with expected outputs to verify the behaviour of a circuit over time. The verification results may be analysed to establish how the circuit has functioned.

A problem is that whilst various cells whose operation has an analog type behaviour are modelled as a VHDL behavioural description or a net list of transistors there is no real verification between the cells response in a true analog simulator such as ELDO. As the cells are analogue cells, the analogue simulator would provide a more accurate reflection of the behaviour of the cell. Certainly no such real verification is achieved by automatic means but it is rather a further requirement for the model writer. As such it can be a further source of error in a design. This problem also applies to digital circuits as they can be regarded as analogue cells with very high gains so that the outputs tend to be rail to rail.

VHDL supports many abstract data types which are used to described different signal strengths or commonly used simulation conditions such as unknowns and high-impedance conditions. These non-standard data types have been adopted by the IEEE as standard 1164. Such data types are not applicable to analog simulators which require true analog signals rather than abstract data types.

SUMMARY OF THE INVENTION

It is an aim of embodiments of the present invention to at least partly mitigate the above problems.

According to one aspect of the present invention there is provided a method of distinguishing between an input or output signal on a bi-directional pin of a model of a hardware circuit, comprising the steps of for a bi-directional pin of said model applying signals to said pin at a reduced drive strength such that a driven signal on said pin will be superimposed over the applied signal; and comparing the drive strength on the said bi-directional pin and responsive to said comparison determining whether the bi-directional pin is an input or output.

Preferably, the method further comprises the step of providing an output to indicate that the bi-directional pin is an input or an output. This output may be to the user or to an operating system.

The model may be a digital model, such as an HDL model or more advantageously a VHDL model. The HDL model may utilise the standard HDL values and strong signals on the bi-directional pin may be replaced by a Z in said applying step.

Preferably, any output from the model has a drive strength greater than said reduced drive strength. In that way, outputs can be distinguished from inputs.

According to a second aspect of the present invention, there is provided a system for distinguishing between an input or output signal on a bi-directional pin of a model of a hardware circuit, said system comprising means for applying signals to a bi-directional pin of said model at a reduced drive strength such that a driven signal on said pin will be superimposed over the applied signal; and means for comparing the drive strength on the said bi-directional pin and responsive to said comparison determining whether the bi-directional pin is an input or output.

BRIEF DESCRIPTION OF THE DRAWINGS

An embodiment of the present invention will now be described by way of example only with reference to the accompanying drawings in which:

FIG. 1 illustrates an inverter logic gate;

FIG. 2 illustrates an inverter logic gate as modelled by an analog model;

DETAILED DESCRIPTION

Figure 3:
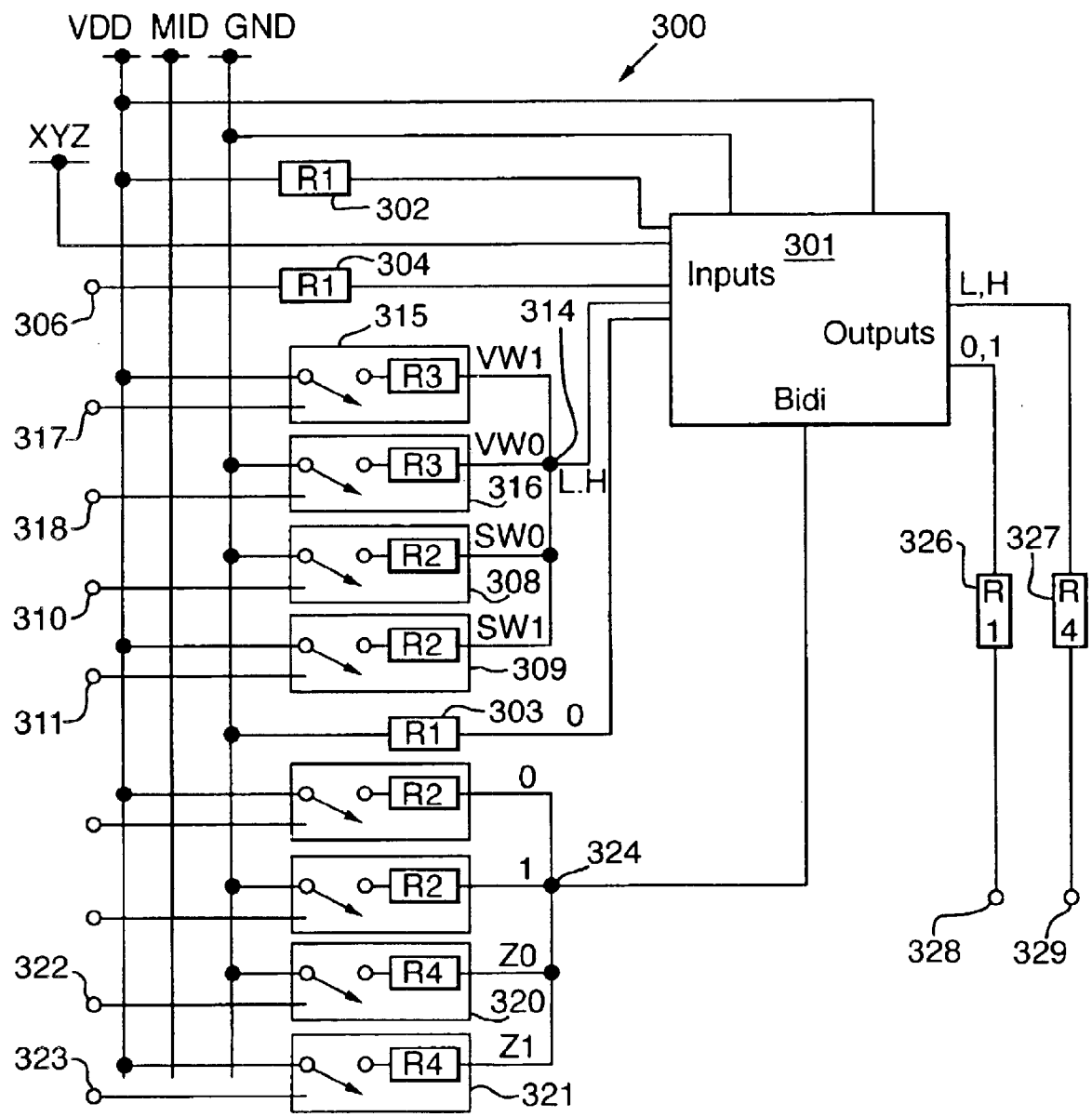
FIG. 3 shows control circuitry for providing input signals to an analog simulation model.

VHDL can describe the behaviour and structure of electronic systems in general and is suited as a language to describe the structure and behaviour of digital electronic hardware designs ie hardware cells. A cell is typically a relatively small part of the overall circuit design. Such device design is described in the VHDL language using the concept of a design entity. Each design entity is divided into two parts, the entity declaration and the architecture body. The entity declaration describes the external interface or connections to the design entity. The architecture body represents the internal description of the design entity such as its structure, behaviour or both.

FIG. 1 illustrates an inverter (INV) gate and it will now be described in VHDL. Considering the INV gate as a single cell, a single input pin and single output pin are required. Power and ground pins are not required to be defined.

The code in which such an inverter gate would be described in VHDL is

1. /*VHDL code for INV gate*/
2. library IEEE
3. use IEEE.STD_LOGIC_1164.all;
4. entity INV is
5. port (
6. A: in STD_LOGIC;
7. F: out STD_LOGIC
8. );
9. end INV;
10. architecture VI of INV is
11. begin
12. F<=not (A) after T;
13. end VI
14. /*end of VHDL code Line 1 is simply a comment which allows the user to make notes referring to the code as a memory aid. The /* and */ notation indicate the start of a comment and the end of the comment respectively. This instructs the compiler to ignore the line of VHDL as the first line does not contain instructions for the compiler.

Lines 2 and 3 are a library clause (library IEEE) and a use clause (use IEEE.STD_LOGIC_1164.all;) respectively. These provide the design entity INV with access to all the names declared in the package STD_LOGIC_1164 stored in the library IEEE and particularly in the data type STD_LOGIC.

The data type of a pin sets out the values of different signal strengths and signals which may flow through the pin.

VHDL supports many such data types which are of an abstract nature including unknowns and high impedance. In order to cater for such abstract values a standard, numbered 1164, has been adopted by the IEEE. This standard defines a standard package containing definitions for a standard 9-valued data type. The standard data type is called standard logic and the IEEE 1164 package is sometimes referred to as the standard logic package or MVL 9 (for multi-value logic 9 values). The standard also defines the logical operations for theses data types, for example the NOT operation.

Each of the nine states of the IEEE 1164 standard logic package are explained below.

'U': This represents a strong unknown, that is as an input a 'U' indicates anything from a strong low to a strong high. If a 'U' is an output nothing has modified the outputs.

'X': This also represents a strong unknown and can be anything from a strong low to a strong high signal. In particular 'X' on an output can indicate that an error has occurred as the signal has passed through the model.

'-': This also represents a strong unknown and as such can be anything from a strong low to a strong high signal. This is sometimes referred to as NOT 'X'. It can provide a good logic level but it is a don't care state where its actual value is unimportant.

'W': This state is a weak version of the 'X' data type noted above.

'L': This data type represents a weak low, that is a low signal having a weak drive strength. This state can also represent a charge storage when used as an output state.

'H': This is exactly the same as an 'L' however in the opposite sense, that is say it represents a weak high.

'0': This is a strong low which can be input directly into a model.

'1': This is a strong high and is the same as a 0 but in the opposite sense.

'Z': This represents a high impedance signal and when used as an input it means nothing drives the node.

Referring back to the VHDL description of the invention, line 4 provides an arbitrary level to the design entity. This line starts the definition of a new VHDL design unit. Because the library and use clauses are written before the entity declaration they do not begin the VHDL description of the design unit, there are merely context clauses.

The entity declaration includes port declarations which are in lines 5 to 9. Ports may be pins on ICs or any other edge connection on a board etc. Technically ports are signals and so signals and ports are read in the same way. The port declaration includes the name of each port, the direction in which information is allowed to flow through the ports and the data type of the ports as described above. The entity declaration is completed by the VHDL word "end". "A" is therefore an input and "F" an output.

The architecture body, which is in lines 10 to 13, represents the internal behaviour and structure of the design entity and is itself given an arbitrary name, in this case V1. The VHDL word "begin" signifies the start of the architecture statement part. The next line, line 12, is a concurrent signal assignment which describes how the design entity will actually function. This line of code is executed each time the input changes value after a time T which can be defined elsewhere. In the case of an inverter the output F is defined as being equal to NOT the input A. The architecture word "end" is used to complete the architecture declaration. The final VHDL comment on line 14 signified by /* is again merely a memory aid.

VHDL can be used to describe more complicated calls.

FIG. 2 shows how an ELDO Spice analog simulator might function to model the same inverter. The analog model includes an input A and an output F similar to the VHDL model. However the analog model describes the function of the analog inverter in relation to the transistors 21 and 22 which are arranged in a conventional inverting array. It will be appreciated that analog simulators can model analog voltage sweeps which are not available to the digital level VHDL models. That is the analog simulator can model voltages between the "O" and "1" levels. A portion of the program code which is executed by the analog model is set out below:
1. .subckt INV A F
2. M1 VDD A F PMOS
3. M2 GND A F NMOS
4. .ends The first line defines a sub circuit which is named INV having an input A and output F. Once again the name is arbitrarily fixed by the programmer. The order in which the ports are listed defines the connectivity. "A" is an output and "F" is an output.

The next two lines, lines 2 and 3, define operation of the parts of the circuit. The parts are listed and comprise M1 (transistor 22) and M2. (transistor 21) which are defined as PMOS and NMOS transistors respectively. The drain, gate and source of transistor M1 are defined as being connected to Vdd, A and F respectively whilst those of M2 are connected to ground GND, A and F respectively. Once again an end-type message on line 4 defines the end of the functional description of the model. The ELDO program includes a library containing details of circuit components, resistors, capacitors transistors etc and includes details of their behaviour.

The relationship with the rest of the circuit can be defined as X1 net1 net70 INV. This indicates that input A is connected to net1 and output F is connected to net70 by an inverter, net1 and net70 represent a net list of the respective components or cells connected to the input A and the output F respectively.

By describing the inverter in terms of the two transistors 21 and 22 in this way, the analog model unlike the digital VHDL model above-described, is able to provide the tool with the functionality to allow it to work with real data types including floating point data type and voltage sweeps. This enables information to be learned about the transitional phases (i.e. where the voltage is between "0" and "high") as the input signal changes from low to high and vice versa. It will be appreciated that whilst such a simulation provides a highly accurate description of the circuit's performance it increases the complexity of the model which consequently takes far longer in run time.

As a consequence digital modelling is typically used, especially where the device design being tested includes large quantities of hardware cells. Verification between the cells response in a true analog simulator (ELDO) and its response in the VHDL model is made. Without this verification, a cell which is tested using the quicker VHDL model may be found to be inoperational when using real data types. Embodiments of the present invention overcome the need for the model writer to make such a verification. This is achieved by automating the verification process as far as possible.

Embodiments of the present invention use WIF files. A WIF (waveform interface format) file is an ASCII based file which contains information needed to describe the model's interface (names of ports, directions of signals—input/output/bi-directional, and types of signals) and signal activity against time in a tabular format. In embodiments of the present invention, the IEEE 9 logic states discussed previously are used to indicate both driven and driving states. The pin direction is then used to determine what needs to be done to either drive the value or test for the existence of a value in one of the many supported simulators. Additional parameters can be specified using specially defined comments. These are then used to alter the behaviour of the tool and the simulations/interpretations performed by the tool.

Figure 6:
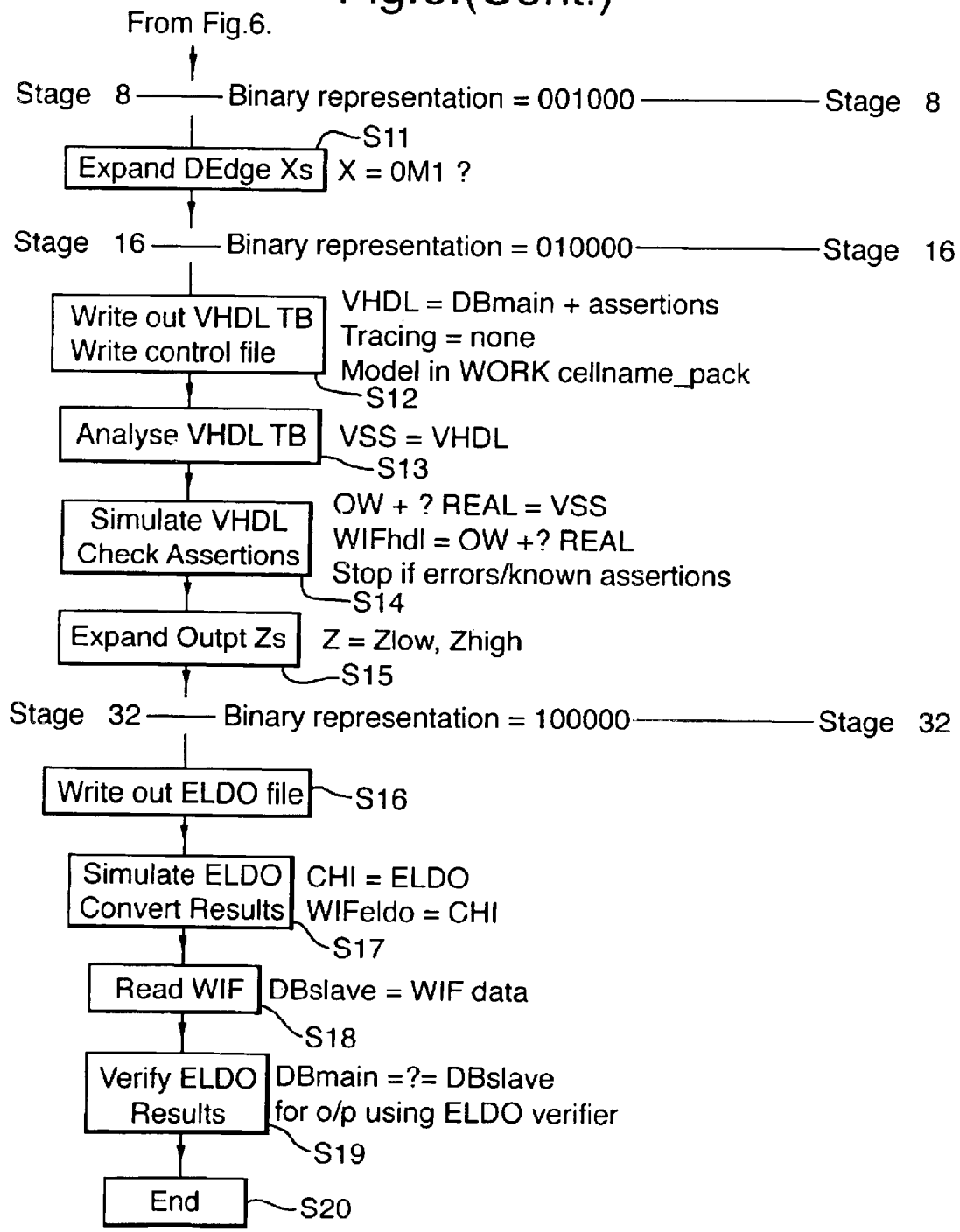
FIG. 6 shows a flow chart of a method embodying the present invention.

WIF2TB is a program or tool embodying the invention. The program WIF2TB (a flow diagram of which is shown in FIG. 6) takes a set of vectors using all nine VHDL logic types and proves by multiple simulations that the VHDL model behaviour is the same as the ELDO simulation. A tool generates an ELDO Spice test bench that reliably reproduces the meanings of the VHDL 9 state logic for use with a Spice model of the circuit under test. The result is a VHDL model which can be added into a VHDL test bench to provide an analog model. This test bench —is connectable to all the ports of the analog model to enable the states of the inputs, outputs and bi-directional pins or the like to be monitored. The tool requires only an input WIF file specifying the pins and vectors. Using this file, the tool then writes its own test bench and a simulation control file. Only pins which are possibly driven by the model need modelling as the tool already knows the input signal activity. The system is strobe driven and the results of the analog simulation are recorded and checked automatically to cross check the response of both simulation runs. If the analogue and digital simulation runs are the same, the VHDL model is verified.

The tool embodying the present invention consists of three parts. In the first of these the VHDL model is monitored whilst performing a normal test bench simulation of the model. The VHDL model uses the IEEE 1164 standard logic package as a data set for stimulating the model. The data are input onto input or bidirectional pins (that is pins on which the signal can either be an input or an output) of the VHDL model. The outputs are observed. The resultant signals on each pin are read into the tool as well as the expected reference results and stored as an ASCII WIF file.

The next stage is to carry out the ELDO simulation. In order to do this the standard VHDL logic package is converted into a data set which is applicable to an analog simulator. This requires those complex data types which are not compatible with analog simulators to be converted into a series of compatible values. The thus expanded logic package is then input onto the corresponding input, output and bidirectional pins of the analog model and the resultant voltage outputs are read into the tool as analog reference results.

In the first stage, all bidirectional pins have the strength of their input signals reduced to weak. This allows the effect of driving the bidirectional pins to be seen during the simulation since if the pin is an output a stronger output signal will be superimposed over the reduced weak input signal and can be measured. Additionally, all the input states for complex levels are expanded into sequences of the simpler logic levels (0, 1, L and H). This results in an input sequence of achievable logic levels complete with expected results for each new vector. Further, any 'Z's on the outputs are expanded into two vectors to allow the program to test for 'Z's in the ELDO simulation.

All this data is then used to write an ELDO test bench that connects to the cell's inputs via a digital to analog converter (DAC) and which can drive the pin to a high or low voltage with different drive strengths. The test bench can also set up a potential divider to provide midband voltages. The actual type of DAC is determined for each pin depending upon what logic states it needs to produce for the simulation. For normal output pins a potential divider is connected to effectively try to force the output pin to a weak unknown.

For pins with varying strengths of output another type of DAC is connected that always tries to drive the pin to a midband voltage using a weaker strength drive than should be present on the output. For an output at high impedance a very weak drive is used to drive the pin low then high to try to prove the pin is floating. All the information to do this is held in the program's working memory.

After the simulation has been run the results are converted into an ASCII WIF file. This is then read into the program, where it can be compared to the expected reference results from the VHDL simulation. Only outputs at 0, 1, L, H and Z are checked as all other states are safe unknowns.

The third stage takes place after the ELDO simulation is carried out using the expanded logic package the results are verified against the expected reference results from the VHDL simulation. Not only can the tool check that the outputs match but further verifications can be made to the results to find potential bad transitions.

In summary, embodiments of the present invention provide a tool which is able to generate an ELDO or other suitable SPICE test bench that reliably reproduces the meanings of the VHDL 9 logic states which can then be used in the SPICE model under test. In the tool embodying the invention, the circuit to be connected to each pin is determined so that the circuit either drives the required voltage onto the pin through a suitable resister to represent the drive strength for the input or opposes the expected output change using the next weakest drive to try to prove that the correct drive strength is modelled. To represent three different drive strengths as proposed in the embodiment of the present invention described in more detail later, four different resistors are used. Two of these resistors bound the so called weak levels. It should be appreciated that in alternative embodiments of the present invention, more or less than three different drive strengths can be provided. Four resistors are used in preferred embodiments of the present invention. However in alternative embodiments of the present invention, more or less than four resistors may be provided. In alternative embodiments, alternative components may be used as well as or instead of the resistors.

The expanded logic package for use with the analog environment is set out below.

'U', 'X', '-': These three strong unknown states can be anything from a strong low to a strong high and so a voltage sweep from zero volts to VDD is used in the analog model to represent the input condition. The voltage sweep is digitised into three voltage levels being driven strongly. Tristate effects can be ignored as the driven effect mimics the floating effect in that the pin could be high or low or anywhere inbetween. The program has the ability to expand these states into a sequence of strongly driven voltages of low, high or midband. As an output condition the three states are irrelevant and so no test is required.

The 0, 1 and M (midband) signals required for the voltage sweep can be simulated in VHDL as 0,1 and X. X states are expanded into user defined sequences of a logic 1 voltage, a logic 0 voltage and a voltage between the two logic voltages. This allows both logic states, potential edges and contention generated mid voltage levels to be generated for an X. The X is therefore expanded into a series of 0 and 1's describing any possible value.

'W': This state is the weak version of the above-mentioned strong unknowns and can therefore be tested in a similar manner using a voltage sweep but with the drive strength of the signals reduced. The state is therefore expanded into a series of 'L' then 'H' as set out below.

'L': This state represents a weak low signal. The weak drive strength is effectively a band between a strong drive strength and a tristated pin. Because of this it is realised as two drive strengths represented by different resistances to represent the two band edges. As a result the program doubles the weak strengths into a very weak and a strong weak strength. If the response of these two is good then any drive in between should also prove to be good. As a result the 'L' becomes weak 'L' and strong 'L'.

'H': This is exactly analogous to the 'L' but in the opposite sense.

'0': This is a strong low and can be input directly. The signal is input through the resistor element because an infinite drive strength is unrealistic.

'1': This is a strong high and is simulated analogously to the '0' but in the opposite sense.

'Z': This is high impedance and when used as an input it means nothing drives the pin. When this is an output then a zero volt to VDD voltage sweep through a resistor leads to the similar voltage on the output pin. If a 'Z' is present on the input then a very weak copy of the 'X' expansion is used to represent it. This is the weakest drive used in the simulation and is less than a very weak 'W'. If a 'Z' is present on an output then the pin is driven high then low using the very weak drive to prove it was really floating. The verification software will subsequently look for a '0' or '1' logic level in the right place to pass this as a correct 'Z' state.

When bidirectional pins of the analog model are being tested all input stimuli are input as weak values so that strong outputs override the input levels. Hence the bidirectional pins are handled by simulating them in VHDL with all the drive strengths reduced to weak. When the cell drives an output it will be a strong drive strength, thus identifying the direction. The VHDL test bench replaces the strong levels with a 'Z' which allows the strong strength to appear. Also by being a 'Z' state it stops 'X' states from causing false assertions which can be the case due to the simplification. As only the finishing level is needed for processing, the test bench has no knowledge of when the pin changed state so if the pin was forced to a level for the full vector other than 'Z' it could change the simulation during this time to cause an error.

By converting the standard logic package into a data set which can provide stimulus to an analog model of a hardware cell a computer system can be operated to verify the accuracy of a VHDL model hardware test circuit. Firstly the VHDL model is simulated with the standard logic package. Afterwards the analog model can be simulated with the converted standard logic package and the results of both stimulations are compared to verify that the VHDL model is an accurate model of the analog model.

FIG. 3 illustrates the circuitry 300 which can be emulated by the program to apply required voltage signals on the input, output and bidirectional pins of the analog model of the hardware cell 301. FIG. 3 shows an ELOO test bench. The test bench provides the stimulation to the model and optionally observes the outputs. The test bench shown in FIG. 3 can be implemented in hardware but is more preferably implemented in software.

The WIF2TB tool expands the stimulus and response levels into a realisable set for the ELDO simulator. The resultant test bench is a mix of voltage supplies and voltage controlled switches with varying ON resistances. Some pins can have very simple circuitry connected to them.

The program has three basic separate algorithms depending on the complexity of the required stimulus for each pin. This is done to reduce the time needed for simulation by using the simplest possible circuit for all cases. The first algorithm basically states that any pin that never changes can be tied off to one of the supplies by a required drive resistor. The second algorithm basically uses a pattern producing voltage supply and a resistor to model any two level stimulus of equal drive. That is any pin which is driven between 0 and 1. The third algorithm defines complex stimuli using voltage controlled switches using pattern producing voltage sources.

For any pin that always has the same state the test bench has written to it a single resistor connected to the relevant supply. If the pin is an input, the supply used is the true level of the pin. If the pin is an output then the voltage used is the voltage of the inverted logic state. The inversion is required to give the output something to drive against to prove its drive strength. Also in the case of an output, the drive strength is reduced.

Because of the algorithm used in expansions, this type of case IS only exists for pins that are held at or drive a strong 0 or 1. Any tie-offs declared in the input WIF file will also have the same kind of circuit used to give the effect. The following table gives all the possible cases for this type of situation:

TABLE T.1

| LEVEL | DIRECTION | RESISTOR USED | SUPPLY USED |
|---|---|---|---|
| Strong 0 | Input | R1 | GND |
| Strong 1 | Input | R1 | $V_{DD}$ |
| Strong 0 | Output/Bidirectional | R2 | $V_{DD}$ |
| Strong 1 | Output/Bidirectional | R2 | GND |

The resistors R1 have the lowest resistance and are used to drive strong signals. The resistors R2 are used for the strong edge of the weak drive strength band. The resistors R4 have the highest resistance and are used to produce the very weakest signals.

In the following, R1 can have a resistance of 100 Ohms, R2 a resistance 100K Ohms, R3 a resistance of 250 K Ohms and R4 a resistance of 1 Megaohm. These values are by way of example only.

In FIG. 3, resistor (R1) 302 is connected between high voltage supply rail VDD and the input to the analog model. This provides the strong 1 state to the analog model. Analogously resistor (R1) 303 is connected to the ground GND supply rail to supply strong 0 signals as inputs to the analog model. In this way inputs to the analog model which are identified as never changing state can be tied off to one of these inputs depending upon whether they are permanently strong high or low signals. This is provided by the first algorithm.

Resistor (R1) 304 is connected between a control input port 306 and the input to the hardware cell 301. By inputting a series of 0 and 1 signals as control signals on terminal 306 a series of strong 0 and 1 signals can be applied to the cell. This is provided by the second algorithm.

The following are used by the third algorithm. Signal generating circuits 308 and 309 each include a voltage control switch connected to a resistor R2. These resistors have an approximate value of 100 kOhms. The circuit 308 is connected to the ground line whilst circuit 309 is connected to the high voltage supply line VDD. Each voltage controlled switch is operable in response to control signals input on control input terminals 310 and 311 respectively. The inputs on these terminals will be a series of 0's and 1's produced by the WIF2TB tool to control the operation of the circuits 308 and 309. The outputs of these two circuits are connected to node 314 which is connected to an input of the hardware cell.

Output signal generating circuits 315 and 316 each include a respective resistive element R3 together with a respective voltage control switch. Circuitry 315 is connected to receive a high voltage signal VDD whilst circuitry 316 is connected to receive the ground signal GND. Control terminals 317 and 318 control the voltage controlled switches in the circuits 315 and 316 respectively. Once again the input signals on the control terminal 317 and 318 will be a series of 0's and 1's produced by the tool to control the output at node 314. The circuitry 308, 309, 315 and 316 are used in the expansion of 'L' and 'H' states into an expanded package suitable for application to the inputs of the analog model of the hardware cell 301.

As described above 'L' states are expanded into very weak low and strong weak low signals. These are provided from circuits 316 and 308 respectively under control of the signals applied to control terminals 318 and 310.

H states are expanded into strong weak high signals and very weak high signals by circuitry 309 and 315 respectively.

Hence any input of the analog model which in the corresponding VHDL model has an L or H state applied to the input can be stimulated by the expanded logic package by applying very weak and strong weak signals to the input. Although node 314 is shown providing only one signal input into the cell 301 it will be understood that any number of inputs of the analog model could be connected to the node 314.

As described hereinbefore some pins may be bidirectional so that it is unknown whether the pin is an input or an output. In order to deal with this situation such pins are input with stimulus having a weak drive strength. In this way strong outputs will override the input. The weak drive strengths are produced by utilising a high resistance element R4 as shown in output circuitry 320,321. Each of these circuits comprises a resistive element R4 connected in series with a voltage controlled switch. Circuit 320 is connected to the ground rail whilst circuit 321 is connected to the high voltage supply VDD. The voltage control switches of each circuit is controlled by input signals input on terminals 322 and 323 respectively. The control signals input on these terminals will be a series of 1's which will operate to open and close the switches in the circuits 320,321 to thereby control the voltage on node 324. The signal at node 324 is connected to the bidirectional pin inputs of the analog model of the hardware cell 301.

Outputs of the analog model can be driven by resistive elements 326 and 327 which operate to provide varying drive strengths for the signals which are input on control terminals 328 and 329 respectively.

For any pin that has got a single drive strength and on which the signal alternates between high and low states a pattern producing voltage source is connected to the pin by the drive modelling resistor. Output pins are driven by the weaker inverted level. Outputs of the analog model are connected to resistive elements 326 and 327 which operate to provide varying drive strengths for the signals which are input on control terminals 328 and 329 respectively. The exception to this is that any output pin with a Z which is driven using the strong drive strength to overcome any capacitance in the output stage. Also inversion is not used in this case as the test bench is trying to prove the pin is free to attain any value. For input pins the very weak drive is used as there should be no drive opposing the change and the capacitance should be small.

The following table shows the possibilities for these next simple cases:

TABLE T.2

| LEVELS | DIRECTION | RESISTOR USED | SENSE |
|---|---|---|---|
| Strong '0', '1' | Input | 1 | Not inverted |
| Strong '0', '1' | Output/Bidirectional | 2 | Inverted |
| Z-0, Z-1 | Input/Bidirectional | 4 | Not inverted |
| Z-0, Z-1 | Output | 4 | Inverted |

Any signals left to generate are a mix of drive strengths and logic levels. These cases may also have midband voltages. The stimulus for these are made by generating control sequences from pattern generating voltage sources that switch on and off the voltage controlled switches. Each switch connects to the required supply by the required resistor. The pattern generating control supplies are named using numbers to identify the required effect. These are index numbers. When a 1 is output the corresponding voltage and drive strength determined by the resistor used is output. When the control sequence signal is low on a voltage controlled switch the element is tristated from the pin. The following table defines what the index number of each control voltage drives:

TABLE T.3

| INDEX | VOLTAGE | RESISTOR USED |
|---|---|---|
| 1 | $V_{DD}$ | R1 |
| 2 | $V_{DD}$ | R2 |
| 4 | $V_{DD}$ | R3 |
| 8 | $V_{DD}$ | R4 |
| 16 | GND | R1 |
| 32 | GND | R2 |
| 64 | GND | R3 |
| 128 | GND | R4 |
| 256 | MID | R1 |
| 512 | MID | R2 |
| 1024 | MID | R3 |
| 2048 | MID | R4 |

As an example consider a 1 pin input which is always driven strongly. In such a case a user would write an ASCII file of the form set out below:
Objects
/name/A:I STD_logic
End
0 ns:0
5 ns:1
10 ns:0
15 ns:X The WIF2TB tool would read this into its memory. Firstly the cell name would be read in, then the pins would be defined. In this case there is only one input and that is labelled A.

I is used to indicate an input, O an output, B a directional pin, and S a signal. The signal S is treated as a bidirectional pin.

The type of input is defined as being of the standard logic type. The levels of the signals are defined below as 0 in the first time period at 0 ns, followed by 1 in the next time period at 5 ns, followed by 0 in the next time period at 10 ns followed by an 'X' in the next time period at 15 ns. The tool also reads in the timing sequence for the signals on the pin A. These are read in as the time units in this case 5 nanoseconds, a conversion rate $1\times10^{-9}$ and then a series of vectors which are formed by analysing the time details and making the steps between the data signals to be an integer number of small time periods. The tool will then analyse the input levels to identify any complex data states such as 'X's which will require expansion into further 0 and 1 states which can be applied to the analog model. As a result the 010X signals which are to be applied will become 010 01. A further vector will be added to account for the expanded series of signals. The WIF2TB tool will then analyse the required analog circuit which will be required to provide the expanded series of inputs. This analysis is carried out with relation to tables T1 to T3 noted above. By scanning down the levels for each pin the tool will record a reference number to show all the required voltages/resistors for the pin.

To begin the tool will analyse the first 0 from the series of signals which are to be applied to the pin of the example. The 0 represents a strong 0 zero signal which is produced by the circuitry 300 by connecting the ground rail to the input via a resistor R1 having the lowest resistance. Referring to Table T3 this provides a reference number 16. The reference number 16 is then reduced to binary format to produce the number 00010000. This value is bitwise OR'd with a pre-existing reference number. In the first instance the default value is 0. The bitwise OR'd result for the first signal is therefore 00010000. Next the tool analyses the next signal which is a strong 1. A strong 1 is provided by connecting the high voltage supply VDD to an input pin of the model through a resistor R1. Referring again to Table T3 this has an index number 1. Again this index number is reduced to binary format to obtain the number 00000001. This binary number is then bitwise OR'd with the existing value 00010000. The result is the binary number 00010001 which provides the reference number output 17. The procedure is repeated for each subsequent signal which is to be applied to that pin. In the present example since all further values are strong 0's or 1's the bitwise operation will not alter the resultant reference number which will be 17. It will be understood that if the series of input signals contain other data types for example L's H's or W's reference would have to be made to the above-mentioned tables to obtain an appropriate index number. The series of signals input would then be analysed as above described to obtain eventually the single reference number for that pin.

The WIF2TB tool will then analyse the reference number output to determine the type of circuit required to connect to the analog model. In the first instance the tool establishes if a pin is to be tied off. In this case the reference number will only have one bit set since the level of signal on the pin will remain at a predetermined value. If the tool identifies that only one bit is set it can connect the input pin directly to one of the supply rails thereby tying off the pin.

The tool then analyses whether the input levels are of a single strength. In this case the reference number will only have two bits set. The reference number will either be 17 indicating that the pin is always strong or 136 (a combination of index numbers 8 and 128) indicating that the pin always has a Z on it. In this case the tool generates control signals to be connected by the terminal 306 (in the case of always strong signals), or terminals 322 and 323 (in the case of always Z). In this example the input levels 01001 may produce a flow of control signals such as 0000011111000000000011111 on the control terminals.

If the reference number has more than 2 bits set the result is a complex series of voltage levels on the pins. As a result many control voltage sources will be required and the tool will produce the required control signals to be output on the control terminals to provide the required levels on the pins of the analog model.

Figure 4:
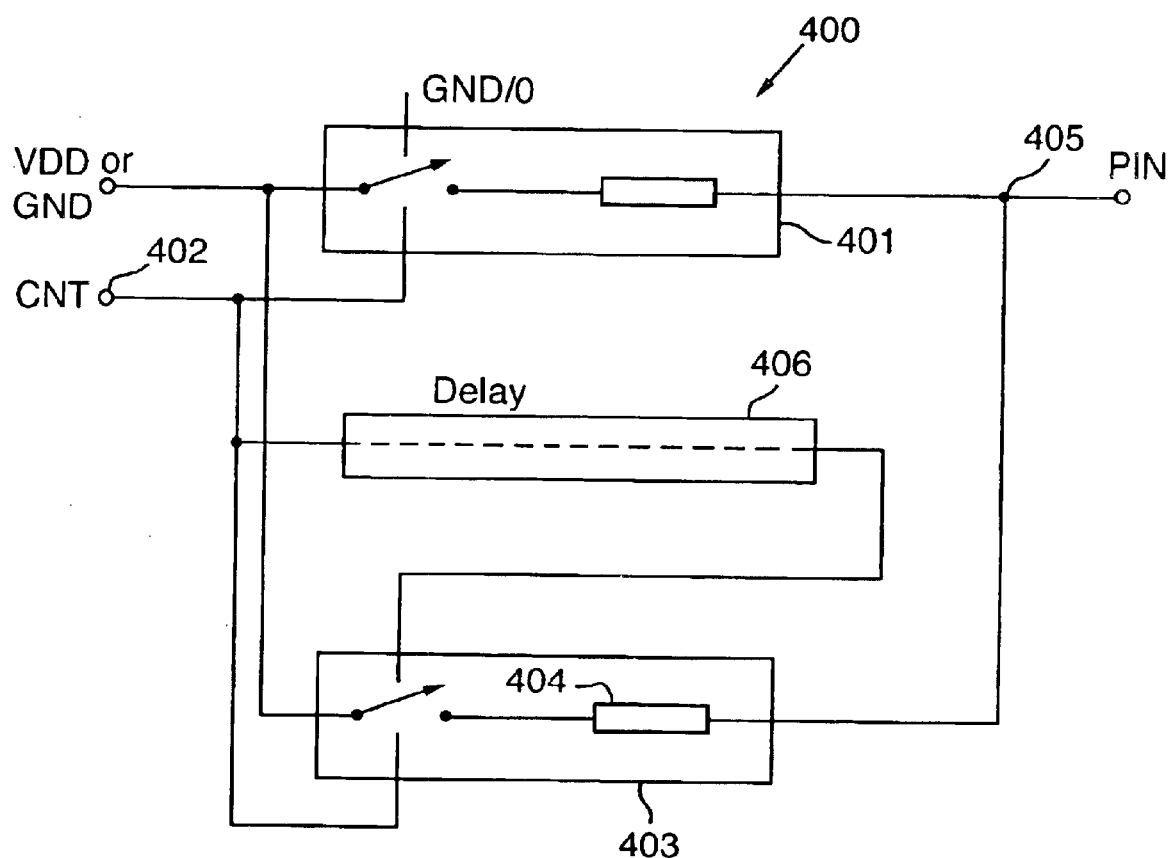
FIG. 4 shows schematically apparatus for reducing the RC delay when testing tristate conditions.

FIG. 4 shows circuitry which can be used to overcome a problem when a Z state is on an output or bidirectional pin. The problem is that although a very weak resistor drive needs to be applied there is likely to be a significant capacitance present unlike on an input pin. Because of this a very large RC time constant could be present. As a result the weak drive strength will take a considerable time to charge up or discharge a signal on the pin thereby increasing simulation times considerably. This circuitry can be implemented in hardware or more preferably in software.

The problem is overcome by using a short circuit connection to be made with a very low resistance element to the supply to charge or discharge the pin. The circuitry 400 shows signal level control circuitry 401 which is analogous to either of the circuits 320, 321 shown in FIG. 3. The circuit 401 includes a high resistor element (for example 1 mega Ohm) connected in series with a voltage controlled switch. The voltage controlled switch is connected to either the high voltage supply rail VDD or the ground line. The voltage control switch itself is controlled by control signal CNT applied to terminal 402. This terminal is analogous to terminals 322 and 323 shown in FIG. 3. As described hereinabove in order to apply the Z state on an output or bidirectional pin a very high resistor element is used to provide a very low drive strength. As a result the capacitance of the pin and the resistance of the circuitry to which it is attached becomes appreciable (the time constant is relatively large) and any signal to be generated on the pin will take some time to develop due to the RC time constant. For this reason a pulse generator circuit 403 is provided which includes the small resistor element 404 (of the order of 1 Ohm). The voltage controlled switch of the circuit 403 is controlled by the control signal CNT. This signal operates to close the switch to connect the pin via node 405 to the voltage supply Vdd or GND. The control signal is also input into a delay element 406 which has a delaying effect upon the signal of around 100 pico seconds. The delayed control signal operates to reopen the switch after the short time thereby disconnecting the short circuit. The result is to produce a short pulse at node 405 to aid in establishing the required signal on the pin. The pulse is sufficiently short so that the short circuit signal does not propagate through the analog model.

In summary, to detect if an output is Z, a very weak high and a very weak low level is applied. Additionally a very short duration pulse (for example between 50 150 pico seconds) to the same voltage is initially applied. This short duration pulse is to overcome large RC delays for the high resistance used and the large capacitance of a typical driver cell. As the pulse is short, the pulse does not have the opportunity the propagate through the active circuit and only alters the voltage on a capacitor. Once the pulse has charged/discharged the capacitor, the very large resistance supplied voltage is all that is left to hold the capacitor's voltage against the leakage current of the driver. If this is small the voltage will not move. If however a larger current path exists the voltage will move from the set level. This difference will indicate that the output was not really a Z but a driven level.

As an alternative to providing the high and low resistance in parallel the low resistance may be switched into the path between the voltage supply and node 405 when the short pulse is applied.

As will be appreciated the steps of running an HDL model of a hardware cell then an analog model and comparing the two results to identify accurate HDL modelling can be relatively time consuming (although quicker than many other methods). Occasionally it is possible to identify an inaccurate HDL model without the requirement to carry out analog simulation and comparison. This is possible when input into the HDL model contain an abstract X data signal. In this situation the HDL model can run first using the X's as input then modifying the X input by expanding each X into a 0 and a 1 and resimulating. The results can then be compared between the unmodified and modified simulations. If the results of the two runs do not match the model can be predicted to be incorrect. Basically if a good logic value is output with an X on the input then the same good logic state should be present if the X is replaced with a sequence containing zeros and ones. If the value no longer matches the original good value the X state modelling of the model is incorrect and a subsequent comparison with the SPICE simulation would also fail. However since the HDL check is much faster time can be saved in identifying such predictably incorrect models.

Figure 5:
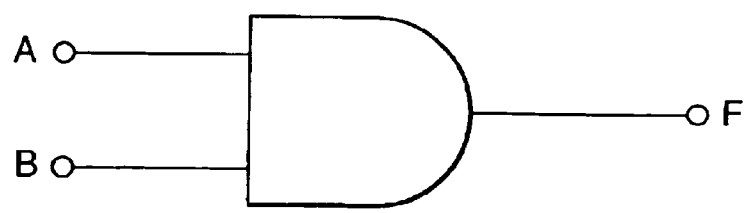
FIG. 5 shows an AND gate.

An example of such an X expansion when run on a HDL model of an AND gate cell is set out below with reference to a conventional AND gate as shown in FIG. 5 and comprising two inputs A and B and a single output F. Table T4 illustrates a possible result table for such a logic gate.

TABLE T4

| A | B | F |
|---|---|---|
| 0 | 0 | 0 |
| 0 | 1 | 0 |
| 1 | 0 | 0 |
| 1 | 1 | 1 |
| X | 0 | 0 |
| 0 | X | 0 |
| X | 1 | 1 |

The first four of these entries illustrate the conventional truth table for an AND gate. However the final three entries refer to the results of the model when an abstract X data type is input into one of the inputs of the HDL model of the AND gate instead of a 0 or a 1.

As described above the X level can represent any strong unknown signal on the input and therefore represents any value from 0 to 1 driven strongly. In the fifth and sixth entries of the Table the model handles the X state correctly since in each case the simple logic level is a 0 and the output from an AND gate must therefore necessarily be 0. However the final entry indicates an incorrect modelling of the AND gate. This is because an X, which represents any strong value from 0 to 1, could be a 0. Since the output from the AND gate when one of the inputs (in the example A) is a 0 should be a 0 the model is clearly incorrect in asserting a 1 on the output.

This fact therefore indicates a bad model of the AND cell. However the fact would not normally be discovered without verifying the HDL model with an analog spice model using the expanded logic package as above-described. Since the analog simulation of a cell is far more time consuming than running an HDL model a check may first be made on the HDL model by expanding each X on the input.

The first step is to run a first HDL simulation as set out below.

Objects
/AND/A: I STD_Logic
/AND/B: I STD_Logic
/AND/F: 0 STD_Logic
End
0 ns:0 0 0
5 ns: 0 1 0

10 ns: 1 0 0
15 ns: 1 1 1
20 ns: X 0 0
25 ns: 0 X 0
30 ns: X 1 1

This provides the necessary information for the HDL model to read in the data according to that shown in Table T4 having the two inputs A and B and an output F all of which may be selected from the standard logic package. In this step X's is on the inputs are left as an X in the simulation. The output column shown as the third column in Table T4 is then stored as a set of expected results from the HDL model.

As a next step each X on the input is expanded into a 0 and a 1. This results in the input data set out below.
0 ns: 0 0
5 ns: 0 1
10 ns: 1 0
15 ns: 1 1
20 ns: 0 0
25 ns: 1 0
30 ns: 0 0
35 ns: 0 1
40 ns: 0 1
45 ns: 1 1

Using these input signals into the HDL model the model is run and the results of the resimulation using the expanded X data are stored as resimulation results. A comparison is then made between the expected results from the initial simulation run with the simulated results from the expanded resimulation run. If the results do not match identically the HDL model can be predicted to handle X states incorrectly and is therefore an incorrect model. A check against an analog model is therefore no longer necessary. This would note that if the inputs are 'X' and '1', the output cannot be '1' if 'X' is '1'. The HDL model therefore fails.

In summary, the 'X' state which represent a strong unknown is expanded to each of its possible values, that is 0 and 1. A check is made in HDL to check that the model works for each 'X' state with 'X' equal to 0 and 'X' equal to 1. If the HDL model does not work in one or more cases, it is determined that the model is flawed. In other words, if one of the states of 'X' does not provide the predicted output, this indicates a problem with the HDL model. This can be done without having to carry out the comparison with the analog model. This saves time and is hence more efficient.

It should be appreciated that this method can be used with any of the other states which represent an.unknown state. In the simple example shown, the 'X' states are on the inputs. It is possible for one or more 'X's to be on one or more outputs. 'X's can be provided on one or more input and one or more output. This may be at the same or different times in the expanded sequence.

The embodiments which have been described hereinbefore have been described in the context of SPICE and HDL. It should be appreciated that embodiments of the present invention may be applied to any other digital and analog simulators.

First, reference will be made to FIG. 6 which shows a flow diagram of the steps carried out by the tool embodying the present invention.

In step S1, the process starts. In step S2, the first WIF file for the inputs is read and stored in a memory. In step S3, the voltages applied to the bidirectional pins are altered so that 0 is changed to L, 1 to H and X to W. In step S4, the VHDL test bench is written out and the control file for the simulator is also written out. In step 5, the VHDL test bench is analysed. The test bench information is read and converted into a form in which it can be used in the simulation.

In step S6, the VHDL is simulated, the results are converted from a binary representation to an ASCII file and the assertions are checked. Assertions may indicate that certain effects have occurred. These may be error conditions.

In step S7, a second WIF file for the outputs is read into memory. In step S8, the output patterns are copied into the original database. In steps S9, S10 and S11, the Xs are expanded. 'X's are expanded. In step S9, level sensitive 'X's are expanded. In step S10 edge sensitive 'X's are expanded. In step S11, double edged 'X's are expanded.

In step S12, the second VHDL test bench is written out along with the control file. In step S13, the VHDL test bench is analysed. In step S14, the second VHDL simulation is run, the results are converted and the assertions checked.

In step S15, the output/input Zs are expanded.

In step S16, the ELDO file is written and in step S17, the ELDO test bench is simulated and the results are converted to a WIF file. In step S18; the WIF file is read in to memory (the second database). In step S19, the results are verified and step S20 is the end.

The following sets out the steps of FIG. 6 in more detail.

SECTION 1—this section provides feedback about options and/or modes given for a run or test. (step S1) p0
W2TB-I-MODE, Using Mode 'eldovhdl'
W2TB-I-SET, Expanding for stages 31
W2TB-I-SET, Adding assertions for stages 16
W2TB-I-SET, Outputting VHDL for stages 18
W2TB-I-SET, Analysing VHDL for stages 18
W2TB-I-SET, VHDL simulating for stages 18
W2TB-I-SET, Results reading for stages 2
W2TB-I-SET, Merging results for stages 2
W2TB-I-SET, Outputting cir for stages 32
W2TB-I-SET, ELDO simulating for stages 32
W2TB-I-SET, Reading ELDO simulation results for stages 32
W2TB-I-SET, Verifying ELDO simulation results for stages 32
W2TB-I-ARCH, Using architecture 'behav' for VHDL simulations
W2TB-I-NETLIST, Using ELDO netlist section 'allcct.net',
W2TB-I-WIFIN, using input WIF 'allcct.wif'
WORK>THEDIR SECTION 2—the WIF file is read in and information is stored in a computer memory. (step S2 and S3)
W2TB-I-WIFIN, Parsing input wif file
WP-I-CIN, Read in comment info
WP-I-PINS, Encountered 15 pins in object block
WP-I-OIN, Read in object block
WP-W-PROGRESS, Percentage of vectors parsed =100%–completed
WP-I-VECS, Total of 61 vectors read
WP-I-DELTA, Smallest delta =5000.00 ps
WP-I-PIN, Read in the test patterns
W2TB-S-IN, Successfully loaded database
SECTION 3—check and if necessary correct the timing
WT2B-I-DELTA, Smallest Delta is 5000.00 ps after analysis (part of step S2)
SECTION 4—write HDL test bench (step S4)
WT2B-I-VHDL, Writing VHDL to file prefixed 'w2tb_all_cct_2'_
SECTION 5—run HDL simulation (steps S5 and S6)
W2TB-I-SYSCMD, Running system command 'vhdlanm -nc -i w2tb_all_cct_2.vhd'
W2TB-I-SYSCMD, Running system command 'vhdlan -nc -i w2tb_all_cct_2_behav.vhd'

W2TB-I-SYSCMD, Running system command 'vhdlan -nc -i w2tb_all_cct_2_netlist.vhd'
W2TB-I-SYSCMD, Running system command 'vhdlan -nc -i w2tb_all_cct_2_cfg.vhd'
W2TB-I-SYSCMD, Running system command 'vhdlsim -nc -i w2tb_all_cct_2.control'
W2TB-I-ASSERT, no assertions detected in last simulation.
SECTION 6—general operation -only WIF (step S6)
W2TB-I-SYSCMD, Running system command 'wif_print ALL_CCT_TEST_BENCH.ow>w2tb'
SECTION 7—read into memory the second WIF file, the outputs only. This is the second database. (step S7)
W2TB-I-WIFIN, Parsing results wif file
WP-I-PINS, Encountered 7 pins in object block
WP-I-OIN, Read in object block
WP-W-PROGRESS, Percentage of vectors parsed=100%-completed
WP-I-VECS, Total of 46 vectors read
WP-I-DELTA, Smallest delta =5000.00 ps
WP-I-PIN, Read in the test patterns
SECTION 8—merge the outputs from the second WIF file into the first database. (step S8)
W2TN-S-IN, Successfully loaded results database
SECTION 9—expand the X vectors (steps S9, S10 and S11)
W2TB-I-XS, Exhaustively expanded level X states, now have 119 vectors
SECTION 10—write the second HDL test bench. (step S12)
WT2B-I-VHDL, Writing VHDL to file prefixed 'w2tb_all_cct_16'
W2TB-I-ASSERT, Adding output testing code
SECTION 11—the second HDL simulation (steps S13 and S14)
W2TB-I-SYSCMD, Running system command 'vhdlan -nc -i w2tb_all_cct_16_.vhd'
W2TB-I-SYSCMD, Running system command 'vhdlan -nc -i w2tb_all_cct_16_behav.vhd'
W2TB-I-SYSCMD, Running system command 'vhdlan -nc -i w2tb_all_cct_16.netlist'
W2TB-I-SYSCMD, Running system command 'vhdlan -nc -i w2tb_all_cct_16_cfg.vhd'
W2TB-I-SYSCMD, Running system command 'vhdlan -nc -i w2tb_all_cct_16.control'
SECTION 12—this checks if the X modelling is correct. If it is, no assertions will be detected. (step S14)
W2TB-I-ASSERT, no assertions detected in last simulation.
W2TB-I-SYSCMD, Running system command 'wif_print ALL_CCT_TEST_BENCH.ow>w2tb'
SECTION 13 Data prepared for SPICE (step S15)
W2TB-I-ZS, Expanded output Z states, now have 204 vectors
SECTION 14—write SPICE test bench (step S16)
W2TB-I-RES, A total of 6 resistors written to the ELDO test bench
W2TB-I-SW, A total of 72 switches written to ELDO test bench
W2TB-I-VOLT, A total of 76 voltage sources written to ELDO test bench
W2TB-I-CURRENT, a total of 0 current sources written to ELDO test bench
W2TB-S-END, ELDO test bench written
SECTION 15—run SPICE simulation (step S17)
W2TB-I-SYSCMD, Running system command '$eldodir/com/eldo-stveer w2tb_all_cct'
W2TB-I-LOG the log of the eldo simulation has the following lines in it

**** 0 errors
**** 0 errors
**** 0 warnings
**** 0 warnings
SECTION 16—convert SPICE to WIF file, outputs only (step S17)
W2TB-I-SYSCMD, running system command '$WIF2TB_ROOT/bin/chi2halfwif w2tb_all_
C2W-I-START, Converting ELDO chi file 'w2rb_all_cct_32.chi' into WIF file 'w2
C2W-I-SIGNALS, Found 7 signal to convert
C2W-I-DONE, converted 269 vectors
SECTION 17—read in WIF file, reuse second database in memory (step S18)
W2TB-I-WIFIN, Parsing ELDO results wif file
WP-I-PINS, Encountered 7 pins in object block
WP-I-OIN, Read in object block
WP-W-PROGRESS, Percentage of vectors parsed=100%-completed
WP-I-VECS, Total of 269 vectors read
WP-I-DELTA, Smallest delta =100.00 ps
WP-I-PIN, Read in the test patterns
W2TN-S-IN, Successfully loaded ELDO database
SECTION 18—check all pins (step S19)
W2TB-I-VERIFY, Verifying pin 'f1'
W2TB-I-STAT, This pin passed all the tests
W2TB-I-VERIFY, Verifying pin 'f2'
W2TB-I-STAT, This pin passed all the tests
W2TB-I-VERIFY, Verifying pin 'f3'
W2TB-I-STAT, This pin passed all the tests
W2TB-I-VERIFY, Verifying pin 'f4'
W2TB-I-STAT, This pin passed all the tests
W2TB-I-VERIFY, Verifying pin 'f5'
W2TB-I-STAT, This pin passed all the tests
W2TB-I-VERIFY, Verifying pin 'f6'
W2TB-I-STAT, This pin passed all the tests
W2TB-I-VERIFY, Verifying pin 'f7'
W2TB-I-STAT, This pin failed 1 times
WT2B-I-STAT, A total of 1 pins failed verification
WT2B-E-FAL, the HDL model is different to the ELDO response It should be appreciated that embodiments of the present invention may be implemented by a computer program or by suitable circuitry. The various circuits described can be implemented in hardware or software. When the verification process has been completed an output signal is provided which indicates if the test has been successful or has failed.

The output of embodiments of the invention provides an indication to a user, for example, on a screen indicating that a test has failed or passed. Optionally, in the case of failure, an explanation as to the cause of failure is provided. The output may also advise the computer operating system if the test has passed and failed. In a preferred embodiment of the invention, a file is created in the operating system which indicates if a test has passed or failed. In the case of failure, the reasons for the failure are written in the file.

As an alternative to VHDL, Verilog can be used.

Embodiments of the present invention can be used to verify models of part or all of an integrated circuit.

It will be apparent to those skilled in the art that modifications could be made to the above-described examples without departing from the scope of the present invention.

What is claimed is:

1. A method of distinguishing between an input and output signal on a bi-directional pin of a model of a hardware circuit the steps of:

for a bi-directional pin of said signals to said bi-directional pin at a reduced drive strength such that a driven signal on said bi-directional pin will be superimposed over the applied signal; and measuring the drive strength of the signal on the bi-directional pin and responsive to said measurement determining whether the bi-directional pin is an input or output.

2. A method as claimed in claim 1, further comprising the step of providing an output to indicate if the bi-directional pin is an input or an output.

3. A method according to claim 1 wherein said model is a digital model.

4. A method according to claim 3 wherein said digital model is a HDL model.

5. A method as claimed in claim 4, wherein the HDL model utilizes the standard HDL values and a strong signal on the bi-directional pin is replaced by a Z in said applying step.

6. A method according to claim 1, wherein any output from said model has a drive strength greater than said reduced drive strength.

7. A computer program comprising program code that, when executed on a computer, perform any of the steps of any of claims 1 to 6.

8. A system for distinguishing between an input and output signal on a bi-directional pin of a model of a hardware circuit, said system comprising:

means for applying signals to a bi-directional pin of said model at a reduced drive strength such that a driven signal on said pin will be super imposed over the applied signal; and means for measuring the drive strength of the signal on the bi-directional pin and responsive to said measurement determining whether the bi-directional pin is an input or output.

9. A system as claimed in claim 8, wherein said system is a computer system.

* * * * *

UNITED STATES PATENT AND TRADEMARK OFFICE
CERTIFICATE OF CORRECTION

PATENT NO. : 6,847,926 B1
DATED : January 25, 2005
INVENTOR(S) : Peter Ballam

It is certified that error appears in the above-identified patent and that said Letters Patent is hereby corrected as shown below:

Column 18,
Line 65, should read -- circuit comprising the steps of --
Line 66, should read -- for a bi-directional pin of said model, applying signals to said --

Column 20,
Line 10, should read -- signal on said bi-directional pin will be super imposed over the --

Signed and Sealed this

Seventeenth Day of May, 2005

JON W. DUDAS
*Director of the United States Patent and Trademark Office*